April 2, 1963 R. F. TSCHANNEN 3,084,216

AUTOMATIC-GAIN-CONTROL SYSTEM

Filed March 2, 1961

United States Patent Office 3,084,216
Patented Apr. 2, 1963

3,084,216

AUTOMATIC-GAIN-CONTROL SYSTEM

Robert F. Tschannen, Lombard, Ill., assignor to Hazeltine Research, Inc., a corporation of Illinois Filed Mar. 2, 1961, Ser. No. 92,851
11 Claims. (Cl. 178—7.3)

Figure 1:
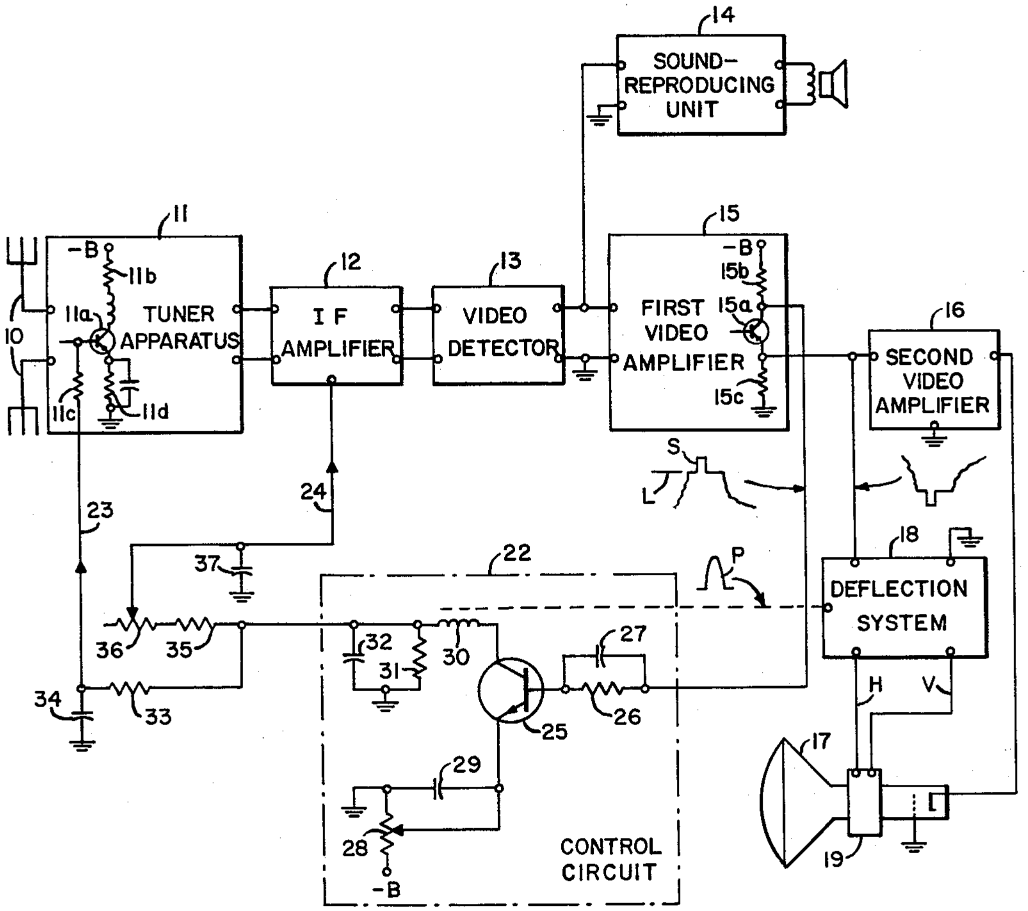

This invention relates to an automatic - gain - control system adapted to provide a residual gain-control effect for use with transistor amplifier circuits of the type wherein maximum signal gain occurs at other than zero operating bias.

The function of an automatic-gain-control (AGC) system is well known. Briefly, the operating bias of a signal-translating amplifier circuit is controlled in a manner that makes the amplifier gain vary inversely of the strength of the translated signal, thereby restricting the strength of the output signal to a relatively small range of values, despite a substantially larger range thereof at the input. Generally, the bias is controlled by deriving from the translated signal a variable bias indicative of signal strength and then using this variable bias to control the amplifier's operating bias.

In a transistor amplifier circuit, as the transistor operating bias, for example, the base-emitter bias in the case of a common emitter circuit, is varied from zero to some steadily increasing forward bias value, the gain of the amplifier increases to a maximum and then decreases. Thus, some finite value of bias is required to operate a transistor amplifier at maximum gain. This is in contradistinction to the usual vacuum tube circuit wherein maximum gain is realized with zero grid-cathode bias. For this reason, it has not heretofore been common practice to rely solely on AGC bias as the operating bias for those transistor amplifiers that are to be biased at maximum, or near maximum, gain under no-signal and weak-signal conditions, for example, the radio-frequency (RF) and intermediate-frequency (IF) amplifiers of a broadcast signal receiver. Instead, auxiliary bias circuits, very often utilizing forward-biased diodes, have been included to insure that the necessary residual bias for maximum gain is maintained. Hereinafter, for the sake of convenience, the phrase "no-signal condition" is intended to include weak-signal conditions where the AGC bias derived from the signal is less than the required residual bias $B_r$.

It is the primary object of this invention to do away with the need for these added auxiliary bias circuits by providing an AGC circuit that will produce both the AGC bias, during the time a signal is being translated, and the residual bias, in the absence of the signal.

In accordance with the invention, there is provided an automatic-gain-control system which comprises means for translating a signal to be stabilized, including a gain-controlled circuit of the type requiring a residual amount of bias in order to have a desired gain characteristic under a no-signal condition. The system also includes means for supplying a signal from which an AGC bias may be derived to stabilize the translated signal and for supplying electrical noise in the absence of such a supplied signal. There is also provided in the system control circuit means for deriving a gain-control bias from the supplied signal and another gain-control bias from the electrical noise. Finally, the system includes means for utilizing the signal-derived control bias to control the gain of the aforementioned circuit during the signal translation and for utilizing the noise-derived control bias as the residual bias under a no-signal condition.

For a better understanding of the present invention, together with other and further objects thereof, reference is had to the following description, taken in connection with the accompanying drawing, and its scope will be pointed out in the appended claims.

Figure 2:
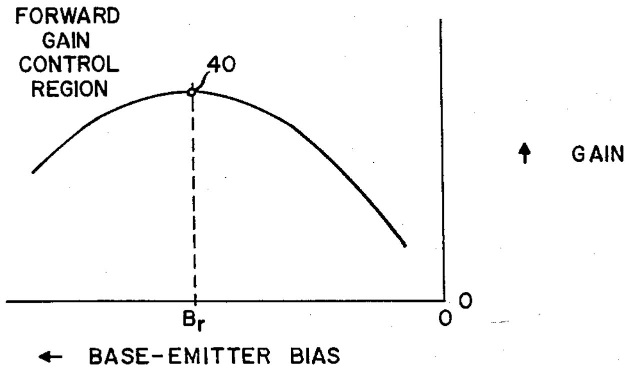

Referring to the drawing:

FIG. 1 shows a television receiver embodying an automatic-gain-control system constructed in accordance with the present invention, and FIG. 2 shows the gain characteristic curve of a transistor amplifier which is used in explaining the operation of the automatic-gain-control system of FIG. 1.

*General Description of Television Receiver*

A description of the basic components of the television receiver shown in FIG. 1 will be considered before taking up in detail the description of the automatic-gain-control system of the present invention. The receiver includes an antenna 10 for intercepting and applying the trasmitted television signal to the input of tuner apparatus 11, conventionally constructed to include a radio-frequency amplifier, partially illustrated in FIG. 1, and a frequency converter, whereby the basic frequency of the received and amplified signal is converted to a fixed IF (intermediate-frequency) value. The signal at the output of tuner 11 is then applied to the input of IF amplifier unit 12, which may include one or more stages of amplification for increasing the ampliude of the signal being translated therethrough to a suitable value for detection in video detector 13. The detected modulation components at the output of detector 13 include the picture and synchronizing signals plus the usual sound carrier on which the audio-frequency sound signal is modulated. The modulated sound carrier is separated out and detected in sound-reproducing unit 14.

The video output circuit of detector 13 is then direct-coupled to first video amplifier 15, and the amplified signal at one output thereof is used to produce the AGC bias in a manner which will be described in detail hereinafter. Briefly, however, the composite signal at the output of amplifier 15, with synchronizing pulses extending in the positive direction, is supplied to control circuit 22, wherein the AGC bias is derived in accordance with the D.-C. level of the sync pulses. This bias is then supplied on lines 23 and 24 to tuner apparatus 11 and amplifier 12, respectively, to control the gain thereof inversely of variatiaons in strength of the signal received at antenna 10.

For image reproduction, the composite signal at another output of amplifier 15 is amplified in second video amplifier 16 and applied to the cathode of picture tube 17. The same signal applied to second video amplifier 16 is also applied to a deflection system 18, of conventional construction, wherein the synchronizing components are separated from the composite signal and used to control the derivation of horizontal and vertical deflection signals H and V which, when applied to deflection yoke 19, produce the beam raster needed for image reproduction in tube 17.

*Automatic-Gain-Control System*

That portion of the FIG. 1 receiver concerned with the automatic-gain-control system will now be considered in greater detail. The system includes means, such as the signal channel including units 11, 12, 13, and 15, for translating the received signal that is to be stabilized. Included in this signal-translating channel is at least one gain-controlled circuit of the type that requires a residual amount of bias in order to have a desired gain characteristic under a no-signal condition. An example of this type of circuit is shown in FIG. 1, wherein there is illustrated, within unit 11, a transistor amplifier circuit that is collector-voltage gain-controlled, sometimes referred to as forward gain-controlled. This method of gain-control is fully described at pages 369–371 of Transistor Circuit Engineering, edited by R. F. Shea, and published by John Wiley & Sons, 1957. Briefly, however, it involves the use of a voltage-dropping resistor 11b in the collector circuit of transistor 11a and an AGC bias that increases as the signal strength increases. Referring to the gain characteristic versus base-emitter bias curve in FIG. 2, the initial bias for the amplifier may be set at a residual value $B_r$ for maximum gain, at point 40, under a no-signal condition. Then, when a signal is received, and as it increases in strength, the base emitter bias increases to the left of the residual bias $B_r$. This causes greater emitter-collector current, increasing the voltage across voltage-dropping resistor 11b and, therefore, decreasing the collector-base voltage on transistor 11a. This lower collector-base voltage reduces the gain of the transistor, as shown by the falling off of the gain curve to the left of point 40. An initial increase in signal strength at antenna 10 is thus cancelled by a loss of gain in tuner 11, and the signal is stabilized at the desired value. Similar gain-controlled circuits are included in IF amplifier 12 to aid in stabilizing the signal strength, and it is the change in gain over the entire signal-translating channel that is normally of concern in determining the amount of control realized.

It is to be emphasized that the transistor amplifier in tuner 11 requires a residual bias $B_r$ to operate at maximum gain with no signal present. If the respective base-emitter biases were to be taken solely from an AGC source in which the no-signal condition were represented by a zero AGC bias from the source, as is the usual case; then, as the signal decreases in strength, the amplifier would be forced to operate in the right-hand region of the gain curve. It can be shown that this may cause a condition known as "lock-out," where it would be impossible for the transistors to revert back to normal operation upon the resumption of signal reception. Therefore, it is important to maintain this residual bias $B_r$ during a no-signal condition; and, as previously mentioned, it is in accordance with this invention that this bias is provided from control circuit 22 without the need for auxiliary bias circuits in the amplifier or forward-biased diodes at the output of the AGC source.

The automatic-gain-control system also includes means for supplying a signal from which an AGC bias useful in stabilizing the aforementioned translated signal may be derived and for supplying electrical noise in the absence of the supplied signal. Such means may comprise the connections from the collector of video amplifier transistor 15a to the input of control circuit 22. In the majority of cases, the translated signal to be stabilized and the supplied signal from which the AGC bias is derived are one and the same; the system of FIG. 1 being an illustration thereof. However, it is possible that the AGC bias may be derived from a different signal than the one to be stabilized. An example of such a situation may be found in copending application of Eric Ribchester, Serial No. 759,056, filed September 4, 1958, entitled "Color-Television Automatic-Gain-Control Apparatus," and assigned to applicant's assignee. In that application, an AGC bias in a color-television receiver is derived from the sound carrier and used to control the gain of the chrominance circuits, i.e., the translated chrominance signal being stabilized not being the same as the supplied sound carrier signal from which the AGC bias is derived. It will be appreciated that the present invention may be used in such an environment.

There is normally a certain amount of electrical noise being translated through the circuits of the receiver. However, by virtue of the reduced gain of the circuits in the presence of a received signal, the signal-to-noise ratio is high and so the noise amplitude is relatively insignificant. However, as pointed out previously in considering the automatic-gain-control action, when the strength of the received signal decreases, the gain of the translating circuits is increased to compensate for the loss of signal strength. This causes the amplitude of random noise generated within the RF and IF amplifiers to be correspondingly increased. Thus, under a no-signal condition, there remains a detectable noise component at the output of first video amplifier 15. Heretofore, this noise component has been considered undesirable.

However, in accordance with the present invention, the AGC system includes control circuit 22, which is adapted not only to derive an automatic-gain-control bias from the video signal at the output of amplifier 15, but also to take advantage of the presence of the noise at the output of video amplifier 15 to derive therefrom a gain-control bias suitable for use as the residual bias $B_r$. There is also provided means for utilizing the signal-derived automatic-gain-control bias to control the gain of the amplifier circuits during signal translation and for utilizing the noise-derived control bias as the residual bias $B_r$ under a no-signal condition. In control circuit 22, the base of an NPN transistor 25 is connected by means of a high impedance network 26, 27 to the collector of the video amplifier transistor 15a. A negative voltage for the emitter of transistor 25 is provided from an adjustable tap on potentiometer 28, by-passed to ground by capacitor 29. Positive-going flyback pulses, P, are applied to the collector of transistor 25 by means of winding 30, which may consist of a few turns around the core of the horizontal output transformer in deflection system 18. A load circuit comprising a parallel combination of resistor 31 and capacitor 32, across which the aforementioned gain-control biases are derived, is coupled from ground through winding 30 to the collector of transistor 25. Circuit 31, 32 preferably has a long time constant relative to the repetition period of the line-frequency flyback pulses in winding 30. The bias across circuit 31, 32 is applied to control the gain of transistor 11a by means of resistor 33 and resistor 11c, the common connection therebetween being by-passed to ground by capacitor 34. Similarly, the circuit 31, 32 bias is applied to the base of the amplifier transistor in unit 12 by means of resistor 35 and adjustable resistor 36, the output tap of which is by-passed to ground by capacitor 37.

In considering the operation of the automatic-gain-control system, it will be assumed initially that a signal is being received at antenna 10. Since the base of transistor 25 is direct-coupled through video amplifier 15 to detector 13, the tip of the synchronizing pulse, S, of the supplied signal represents the strength of the television signal being translated through units 11 and 12. The base-emitter bias of transistor 25 is set by threshold control potentiometer 28 to maintain the transistor non-conductive for the video portion of the supplied signal and for any low amplitude noise components occurring during the video portion of the signal but not extending above the blanking level, L. During the interval between the occurrence of flyback pulses in winding 30, a small reverse bias is maintained on the base-collector junction of transistor 25. It will be appreciated that with this arrangement of biasing, transistor 25 operates as an amplifier of any components of the supplied signal extending beyond the blanking level and into the synchronizing signal region. This means that the transistor will conduct on both synchronizing signal and high-amplitude video noise pulses. However, if the excursion of the composite signal at the collector of transistor 15a is arranged so that the tips of the synchronizing pulses, S, occur very near saturation, the stage becomes an effective impulse noise clipper and this impulse noise exerts little influence on the developed control bias voltage.

The flyback pulses in winding 30 occur in synchronism with the synchronizing intervals of the applied signal at the base of transistor 25. Since the synchronizing pulses extend beyond the blanking level of the input signal, they operate to drive transistor 25 into conduction, charging load circuit 31, 32 negatively to a value determined by the level of the tips of the synchronizing pulses S. As a result of the increased reverse bias on the base-collector junction produced by the flyback pulse, the transistor conducts more heavily on the synchronizing pulses than on the video noise impulses, thus causing the AGC bias across load circuit 31, 32 to be determined substantially only during the occurrence of the flyback pulse.

Summarizing the keyed operation of transistor 25, the transistor is biased beyond current cutoff for normal ranges of the video signal at the base thereof, and this bias is so arranged to enable the transistor to conduct when the signal extends beyond the blanking level, as during the occurrence of synchronizing pulses. Any noise pulses occurring during the video portion of the input signal drive the transistor into saturation almost immediately, due to the low average base-collector bias, and are thus current-limited in the load circuit 31, 32, producing relatively little change in the voltage developed across the latter circuit. However, because of the increased collector voltage momentarily produced by the flyback pulse, the synchronizing pulse does not drive transistor 25 into a saturated condition, and the resulting relatively heavy surge of collector current flow principally determines the AGC level across load circuit 31, 32.

Considering now the operation of the AGC system in the absence of a received signal, i.e., when it is desired to develop the residual bias, $B_r$, the loop gain of the signal-translating channel and control circuit 22, as previously mentioned, is sufficient to cause video amplifier transistor 15*a* to be driven into conduction on the thermal noise developed within the system and which appears at its base. Control circuit transistor 25 responds to this thermal noise, during the keying interval, to produce an average current flow through load circuit 31, 32. Since transistor 25 operates as an amplifier, this average current flow through load circuit 31, 32 is sufficient to make the bias developed thereacross useful as the residual bias $B_r$. The actual bias developed will, of course, depend on the AGC loop gain, the amount of thermally developed noise, and the value of resistor 31.

While applicant does not wish to be limited to any particular set of circuit constants, the following have proved useful in the automatic-gain-control system of FIG. 1:

| | |
|---|---|
| Resistor **11***b* | 2.2 kilohms. |
| Resistor **11***c* | 1 kilohm. |
| Resistor **11***d* | 680 ohms. |
| Resistors **15***b* and **15***c* | 1 kilohm, each. |
| Resistor **26** | 33 kilohms. |
| Resistor **28** | 10 kilohms, max. |
| Resistor **31** | 1.8 kilohms. |
| Resistor **33** | 10 kilohms. |
| Resistor **35** | 1 kilohm. |
| Resistor **36** | 25 kilohms, max. |
| Capacitor **27** | 0.001 microfarad. |
| Capacitor **29** | 4 microfarads. |
| Capacitor **32** | 0.1 microfarad. |
| Capacitors **34** and **37** | 4 microfarads, each. |
| Winding **30** | 4 turns around horizontal output transformer. |
| Transistor **11***a* | T–1561 (Philco). |
| Transistor **15***a* | 999 R325 (T.I.). |
| Transistor **25** | 2N1306. |

While there has been described what is, at present, considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. An automatic-gain-control system comprising: means for translating a signal to be stabilized, including a gain-controlled circuit of the type requiring a residual amount of bias in order to have a desired gain characteristic under a no-signal condition; means for supplying a signal from which an automatic-gain-control bias may be derived to stabilize the translated signal and for supplying electrical noise in the absence of said supplied signal; means for deriving a gain-control bias from said supplied signal and another gain-control bias from said electrical noise; and means for utilizing the signal-derived control bias to control the gain of said circuit during said signal translation and for utilizing the noise-derived control bias as said residual bias under a no-signal condition.

2. An automatic-gain-control system comprising: means for translating a signal to be stabilized, including a gain-controlled transistor amplifier circuit requiring a residual operating bias in order to have a desired gain characteristic under a no-signal condition; means for supplying a signal from which an automatic-gain-control bias may be derived to stabilize the translated signal and for supplying thermal noise in the absence of said supplied signal; means for deriving an automatic-gain-control bias from said supplied signal and a fixed bias from said thermal noise; and means for utilizing said automatic-gain-control bias to control the gain of said circuit during said signal translation and for utilizing the noise-derived fixed bias as said residual bias under a no-signal condition.

3. An automatic-gain-control system comprising: means for translating a signal to be stabilized, including a forward gain-controlled transistor amplifier circuit requiring an increasing base-emitter bias with increasing signal strength to stabilize said signal and a minimum base-emitter bias in order to have a desired gain characteristic under a no-signal condition; means for supplying a signal from which an automatic-gain-control bias may be derived to stabilize the translated signal and for supplying thermal noise in the absence of said supplied signal; means for deriving a forward automatic-gain-control bias from said supplied signal and a fixed bias from said thermal noise; and means for utilizing said forward control bias as the transistor base-emitter bias to control the gain of said circuit during said signal translation and for utilizing said noise-derived fixed bias as the minimum base-emitter bias on said transistor under a no-signal condition.

4. An automatic-gain-control system comprising: means for translating a signal to be stabilized, including, in cascade, a plurality of gain-controlled transistor amplifier circuits each requiring a residual operating bias in order to have a desired gain characteristic under a no-signal condition; means for supplying a signal from which an automatic-gain-control bias may be derived to stabilize the translated signal and for suppling thermal noise in the absence of said supplied signal; means for deriving an automatic-gain-control bias from said supplied signal and a fixed bias from said thermal noise; and means for utilizing said automatic-gain-control bias to control the gain of said circuits during said signal translation and for utilizing the noise-derived fixed bias as said residual bias under a no-signal condition.

5. An automatic-gain-control system comprising: means for translating a signal to be stabilized, including a gain-controlled circuit of the type requiring a residual amount of bias in order to have a desired gain characteristic under a no-signal condition; means for supplying a signal from which an automatic-gain-control bias may be derived to stabilize the translated signal and for supplying thermal noise in the simultaneous absence of said supplied and said translated signals; means for deriving a gain-control bias from said supplied signal and another gain-control bias from said thermal noise; and means for utilizing the signal-derived control bias to control the gain of said circuit during said signal translation and for utilizing the noise-derived control bias as said residual bias under a no-signal condition.

6. An automatic-gain-control system comprising:

means for translating and supplying a signal to be stabilized, including a gain-controlled circuit of the type requiring a residual amount of bias in order to have a desired gain characteristic under a no-signal condition, said means also supplying thermal noise in the absence of said signal; means for deriving a gain-control bias from said signal and another gain-control bias from said thermal noise; and means for utilizing the signal-derived control bias to control the gain of said circuit during said signal translation and for utilizing the noise-derived control bias as said residual bias under a no-signal condition.

7. An automatic-gain-control system comprising: means for translating and supplying a signal to be stabilized, including a gain-controlled transistor amplifier circuit of the type requiring a residual amount of bias in order to have a desired gain characteristic under a no-signal condition, said means also supplying thermal noise in the absence of said signal; means for deriving a dynamic gain-control bias from said signal and a fixed gain-control bias from said thermal noise; and means for utilizing the signal-derived bias to control the gain of said circuit during said signal translation and for utilizing the noise-derived control bias as said residual bias under a no-signal condition.

8. An automatic-gain-control system comprising: means for translating and supplying a signal to be stabilized, including a forward gain-controlled transistor amplifier circuit of the type requiring an increasing base-emitter bias with increasing signal strength to stabilize said signal and a minimum base-emitter bias in order to have a desired gain characteristic under a no-signal condition, said means also supplying thermal noise in the absence of said signal; means for deriving a forward automatic-gain-control bias from said signal and a fixed bias from said thermal noise; and means for utilizing said forward control bias as the transistor base-emitter bias to control the gain of said circuit during said signal translation and for utilizing said fixed bias as the minimum base-emitter bias on said transistor under a no-signal condition.

9. An automatic-gain-control system for a television receiver comprising: means for translating a television signal to be stabilized, including a gain-controlled circuit of the type requiring a residual amount of bias in order to have a desired gain characteristic under a no-signal condition; means for supplying a signal having a characteristic indicative of the amount of stabilization needed for the translated television signal and for supplying thermal noise in the absence of said supplied signal; means for deriving a gain-control bias from said characteristic of the supplied signal and another gain-control bias from said thermal noise; and means for utilizing the signal-derived control bias to control the gain of said circuit during said signal translation and for utilizing the noise-derived control bias as said residual bias under a no-signal condition.

10. An automatic-gain-control system for a television receiver comprising: means for translating a television signal at carrier frequency subject to variations in strength to be stabilized, including a forward gain-control transistor amplifier circuit requiring an increasing base-emitter bias with increasing signal strength to stabilize said signal and a minimum base-emitter bias in order to have a desired gain characteristic under a no-signal condition; means for supplying a video-frequency signal having a characteristic representative of said variations in carrier signal strength and for supplying thermal noise in the absence of said video-frequency signal; means for deriving a forward automatic-gain-control bias from said characteristic of the video-frequency signal and a fixed bias from said thermal noise; and means for utilizing said forward control bias as the transistor base-emitter bias to control the gain of said circuit during said signal translation and for utilizing said fixed bias as the minimum base-emitter bias on said transistor under a no-signal condition.

11. An automatic-gain-control system for a television receiver comprising: means for translating a television signal at carrier frequency subject to variations in strength to be stabilized, including a forward gain-controlled transistor amplifier circuit requiring an increasing base-emitter bias with increasing signal strength to stabilize said signal and a minimum base-emitter bias in order to have a desired gain characteristic under a no-signal condition; means for supplying a video-frequency signal, a portion of which has a characteristic representative of said carrier signal strength and for supplying thermal noise in the absence of said supplied signal; means, including a source of keying pulses synchronous with said signal portion and a transistor amplifier circuit responsive to said pulses and said portion of the video-frequency signal for deriving therefrom a forward automatic-gain-control bias, and a fixed bias from said thermal noise; and means for utilizing said forward control bias as the transistor base-emitter bias to control the gain of said circuit during said signal translation and for utilizing said fixed bias as the minimum base-emitter bias on said transistor under a no-signal condition.

References Cited in the file of this patent

UNITED STATES PATENTS 2,906,817 Kidd ------------------ Sept. 29, 1959